United States Patent
Park et al.

(10) Patent No.: US 6,870,197 B2
(45) Date of Patent: Mar. 22, 2005

(54) DUAL PANEL TYPE ORGANIC ELECTROLUMINESCENT DISPLAY DEVICE AND METHOD OF FABRICATING THE SAME

(75) Inventors: Jae-Yong Park, Gyeonggi-do (KR); Choong-Keun Yoo, Inchcon (KR); Ock-Hee Kim, Gyeonggi-do (KR); Nam-Yang Lee, Gyeonggi-do (KR); Kwan-Soo Kim, Gyeonggi-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 28 days.

(21) Appl. No.: 10/608,471

(22) Filed: Jun. 30, 2003

(65) Prior Publication Data

US 2004/0031959 A1 Feb. 19, 2004

(30) Foreign Application Priority Data

Aug. 14, 2002 (KR) ................................ 10-2002-0048103

(51) Int. Cl.$^7$ ............................................. H01L 33/00
(52) U.S. Cl. ........................... 257/98; 257/682; 438/29; 438/69; 438/115
(58) Field of Search .................. 257/628, 98, E31.095, 257/E31.129, E33.061; 438/115, 29–32, 69–72; 313/499–501

(56) References Cited

U.S. PATENT DOCUMENTS

| 5,051,654 | A | * | 9/1991 | Nativi et al. | 313/506 |
| 6,561,666 | B2 | * | 5/2003 | Park | 362/84 |
| 6,628,086 | B2 | * | 9/2003 | Hayashi et al. | 315/169.3 |
| 2003/0186018 | A1 | * | 10/2003 | Ishii et al. | 428/68 |

FOREIGN PATENT DOCUMENTS

| EP | 374050 A | * 6/1990 | H05B/33/04 |
| JP | 2001-117509 | 4/2001 | |
| JP | 2002-151253 | 5/2002 | |

* cited by examiner

*Primary Examiner*—Paul E Brock, II
(74) *Attorney, Agent, or Firm*—Morgan Lewis & Bockius LLP

(57) ABSTRACT

A dual panel type organic electroluminescent device includes first and second substrates bonded together by a seal pattern, the first and second substrates including a plurality of sub-pixel regions, a plurality of array elements including a plurality of thin film transistors on the first substrate, a plurality of organic electroluminescent diodes on the second substrate, each of the organic electroluminescent diodes having a first electrode on a rear surface of the second substrate, an organic electroluminescent layer on a rear surface of the first electrode, a second electrode on a rear surface of the organic electroluminescent layer that corresponds to respective ones of the sub-pixel regions, a plurality of connecting electrodes connected to the thin film transistors over the first substrate, a plurality of electrical connecting patterns formed on each of the connecting electrodes, each of the electrical connecting patterns electrically interconnecting each of the thin film transistors to one of the organic electroluminescent diodes, and a plurality of hygroscopic patterns formed on portions of the connecting electrodes.

30 Claims, 7 Drawing Sheets

DUAL PANEL TYPE ORGANIC ELECTROLUMINESCENT DISPLAY DEVICE AND METHOD OF FABRICATING THE SAME

The present invention claims the benefit of Korean Patent Application No. 2002-048103 filed in Korea on Aug. 14, 2002, which is hereby incorporated by reference.

BACKGROUND OF THE INVENTION

1. Field of the Invention

The present invention relates to a display device and a method of fabricating a display device, and more particularly, to an organic electroluminescent display device and method of fabricating an organic electroluminescent display device.

2. Discussion of the Related Art

Flat panel display devices, which are characterized as having a thin profile, light weight, and energy efficient, can be classified into one of two types depending on whether it emits or receives light. A first type is a light-emitting type that emits light to display images, and a second type is a light-receiving type that uses an external light source to display images. Plasma display panels, field emission display devices, and electroluminescence display devices are examples of the light-emitting type display devices, whereas liquid crystal displays are examples of the light-receiving type display devices.

Among the different types of flat panel display devices, liquid crystal display (LCD) devices are commonly used for laptop computers and desktop monitors because of their high image resolution, good color production, and superior image quality. However, the LCD devices have some disadvantages, such as poor contrast ratios, narrow viewing angles, and limited sizes. Accordingly, new types of flat panel displays are required to overcome these disadvantages, but yet still maintain a thin profile, light weight and have low power consumption.

Organic electroluminescent display (OELD) devices have been developed because of their wide viewing angles and good contrast ratios, as compared to the LCD devices. The OELD devices are light-emitting type display devices that do not require a backlight device, and are light weight and have a thin profile. In addition, the OELD devices have low power consumption, wherein a low voltage direct current can be used to drive the OELD devices while obtaining rapid response speeds. Since the OELD devices are solid state devices, unlike the LCD devices, they are sufficiently strong to withstand external impact, have relatively larger operational temperature ranges, and can be manufactured at lower costs than LCD devices. Moreover, since only deposition and encapsulation apparatus are necessary and injection of liquid crystal materials is unnecessary, process management is simpler than the manufacturing of LCD devices.

One method for operating an OELD device is a passive matrix operating method that does not utilize thin film transistors, wherein scanning lines and signal lines are arranged in a matrix configuration to perpendicularly cross each other and a scanning voltage is sequentially supplied to the scanning lines to operate each pixel. In order to obtain a required average luminance, the instantaneous luminances of each pixel during a selected period is intensified by increasing the number of scans during the period.

Another method of operating an OELD device is an active matrix operating method, wherein thin film transistor pairs, which create a voltage storing capability for each of the pixels, include a selection transistor and a drive transistor. The source/drain of the selection transistor is connected to a signal line for supplying a data signal when a scanning signal is supplied to the gate scanning line, and the gate of the drive transistor is connected to the source/drain of the selection transistor and a constant voltage line is connected to the source/drain of the drive transistor. In the active matrix type OELD device, a voltage supplied to the pixels is stored in storage capacitors, thereby maintaining the signals until a next period for supplying a signal voltage begins. As a result, a substantially constant current flows through the pixels, and the OELD device emits light at a substantially constant luminance during one frame period. Since a very low current is supplied to each pixel of an active matrix type OELD device, it is possible to enlarge the display device to form finer and/or larger image patterns having low power consumption.

FIG. 1 is a schematic circuit diagram of a pixel region in an active matrix type OELD device according to the related art. In FIG. 1, scanning lines are arranged along a transverse direction, and signal lines are arranged along a longitudinal direction perpendicular to the scanning lines. A power supply line is connected to a power supply to provide a voltage to drive transistors and is disposed along the longitudinal direction, wherein a pixel region is defined between a pair of signal lines and a pair of scanning lines. Each selection transistor, which is commonly known as a switching thin film transistor (TFT), is disposed in the pixel region near the crossing of the scanning line and the signal line and functions as an addressing element to control the voltage of a pixel electrode. A storage capacitor $C_{ST}$ is connected to the power supply line and the drain/source of the switching TFT. Accordingly, each drive transistor, which is commonly known as a driving TFT, has a gate electrode connected to the storage capacitor $C_{ST}$ and a source/drain connected to the power supply line and functions as a current source element for the pixel electrode.

In FIG. 1, an organic electroluminescent diode is connected to the drain/source of drive transistor, and includes a multi-layer structure having organic thin films provided between an anode electrode and a cathode electrode. When a forward current is supplied to the organic electroluminescent diode, electron-hole pairs combine in an organic electroluminescent layer as a result of formation of a P-N junction between the anode electrode, which provides holes, and the cathode electrode, which provides electrons. The electron-hole pairs have a larger energy together when combined than when they were separated. The energy gap between combined and separated electron-hole pairs is converted into light by an organic electroluminescent element. That is, the organic electroluminescent layer emits the energy generated due to the recombination of electrons and holes when a current flows.

Organic electroluminescent devices are classified into top emission type and bottom emission type in accordance with a progressive direction of light emitted from the organic electroluminescent diode. In the bottom emission type device, light is emitted along a direction toward the substrate where the various lines and TFTs are disposed. However, in the top emission type device, light is emitted along a direction opposite to the substrate where the lines and TFTs are disposed.

FIG. 2 is a partial cross sectional view of a bottom emission type OELD device including one pixel region having red (R), green (G), and blue (B) sub-pixel regions according to the related art. In FIG. 2, first and second substrates 10 and 30 are bonded to each other using a seal pattern 40, wherein thin film transistors T and first electrodes 12 are formed on the first substrate 10, which is transparent. The pixel of the organic electroluminescent device generally includes three sub-pixel regions with the thin film transistor T and one of the first electrodes 12 disposed within each sub-pixel region. An organic electroluminescent layer 14 is formed over the thin film transistors T and over the first electrodes 12 and includes luminous materials that produce red (R), green (G), and blue (B) colors each corresponding to each thin film transistor T within each sub-pixel region. A second electrode 16 is formed on the organic electroluminescent layer 14, wherein the first and second electrodes 12 and 16 supply the electric charges to the organic electroluminescent layer 14.

The seal pattern 40 bonds the first and second substrates 10 and 30 together to maintain a cell gap therebetween. Furthermore, a hygroscopic material or a moisture absorbent material 22 is formed on an inner surface of the second substrate 30 in order to absorb any moisture within the cell gap between the first and second substrates 10 and 30 to protect the cell gap from moisture. In addition, a translucent tape 25 is formed on the second substrate 30 and the hygroscopic material 22 is tightly adhered to the second substrate 30.

In FIG. 2, if the first electrode 12 is an anode and the second electrode 16 is a cathode, the first electrode 12 is formed of a transparent conductive material and the second electrode 16 is formed of a metal having a small work function. Furthermore, the organic electroluminescent layer 14 includes a hole injection layer 14a, a hole transporting layer 14b, an emission layer 14c, and an electron transporting layer 14d in a sequential order from the first electrode 12. Accordingly, the emission layer 14c includes luminous materials that emit red (R), green (G), and blue (B) colors in an alternate order in the corresponding sub-pixel regions.

FIG. 3 is an enlarged cross sectional view of one pixel of the bottom emission type OELD device of FIG. 2 according to the related art. In FIG. 3, an organic electroluminescent display device includes a thin film transistor (TFT) T and an organic electroluminescent diode E in a luminous emitting area L. In addition, a buffer layer 32 is formed on the transparent substrate 10, wherein the TFT T includes a semiconductor layer 62 on the buffer layer 32, a gate electrode 68, a source electrode 80, and a drain electrode 82. A power electrode 72 extends from the power supply line to be connected to the source electrode 80, and the organic electroluminescent diode E is connected to the drain electrode 82. A capacitor electrode 64 made of the same material as the semiconductor layer 62 is disposed below the power electrode 72. The power electrode 72 corresponds to the capacitor electrode 64, and an insulator is interposed therebetween, thereby forming a storage capacitor $C_{ST}$.

The organic electroluminescent diode E includes the first electrode 12, the second electrode 16, and the organic electroluminescent layer 14 interposed between the first electrode 12 and the second electrode 16. The OELD device shown in FIG. 3 includes the luminous area L where the organic electroluminescent diode E emits light produced therein. Furthermore, the organic electroluminescent display device has array elements A that include the TFT T, the storage capacitor $C_{ST}$, and various lines and insulators upon which the organic electroluminescent diode E is disposed. Accordingly, the organic electroluminescent diode E and the array elements A are formed on the same substrate.

FIG. 4 is a flow chart showing a fabrication process of the OELD device of FIG. 3 according to the related art. In FIG. 4, step st1 includes a process for forming the array elements on a first transparent substrate. For example, the scanning lines, the signal lines, and the switching and driving thin film transistors are formed on and over the first substrate, wherein the signal lines are formed perpendicularly to cross the scanning lines. Each of the switching thin film transistors is disposed near a crossing of the scanning and signal lines. In addition, formation of the array elements also includes forming the storage capacitors and the power supply lines, wherein each of the driving thin film transistors is disposed near a crossing of the scanning and power supply lines.

A step st2, includes formation of the first electrodes of the organic electroluminescent diode, wherein the first electrode is provided within each of sub-pixel regions. Each of the first electrodes are also connected to the drain/source of the driving thin film transistor within each of the sub-pixel regions.

A step st3 includes formation of an organic electroluminescent layer on the first electrodes. If the first electrodes are the anode, then the organic electroluminescent layer is formed to have a sequential multiple structure of a hole injection layer, a hole transporting layer, an emission layer, and an electron transporting layer on the first electrode. Conversely, if the first electrodes are the cathode, the sequence is reversed.

A step st4 includes forming the second electrode of the organic electroluminescent diode on the organic electroluminescent layer to cover an entire surface of the first substrate, wherein the second electrode functions as a common electrode.

A step st5 includes encapsulation of the first and second substrates, wherein a second substrate is bonded to the first substrate having the array elements and the organic electroluminescent diode. The second substrate protects the organic electroluminescent diode of the first substrate from external impact. Accordingly, since the first substrate is encapsulated with the second substrate, the organic electroluminescent diode is protected from an ambient atmosphere exterior to the device. As previously described, the second substrate includes the hygroscopic material on the inner surface thereof.

A yield of an OELD device is determined by both the yield of array elements and the yield of the organic electroluminescent layer, wherein the fabrication yield of the organic electroluminescent layer determines and controls the total fabrication yield of the OELD device. For example, although the thin film transistors are formed without any defects on the first substrate, the first substrate having both the array elements and the organic electroluminescent layer can be determined to be inferior if defects are generated during later processes for forming the organic electroluminescent layer. Thus, it is a waste of time and cost to fabricate the array elements on the first substrate when defects later occur in the organic electroluminescent layer during the fabrication.

Moreover, in the bottom emission type device, light is emitted along the direction toward the substrate where the lines and TFTs are disposed. Therefore, the display area decreases because the emitted light is blocked by these lines and TFTs. In the top emission type device, since light is emitted along the direction opposite to the substrate where the lines and TFTs are disposed, the display area can increase and thereby simplifying design the TFTs. However, since the top emission type OELD device has the cathode electrode on the organic electroluminescent layer, the cathode electrode is commonly formed of a transparent or translucent material that may block some of the light emitted from the organic electroluminescent layer that decreases light efficiency. Furthermore, there are some limitations in selecting the transparent or translucent material for the cathode second electrode.

To prevent a reduction of light permeability, a thin film passivation layer may be formed over an entire surface of the substrate. However, infiltration of ambient atmosphere from an exterior of the device is not prevented and affects the organic electroluminescent diode.

SUMMARY OF THE INVENTION

Accordingly, the present invention is directed to an OELD device and a method of fabricating an OELD device that substantially obviates one or more of the problems due to limitations and disadvantages of the related art.

An object of the present invention is to provide an active matrix OELD device having improved fabrication yield.

Another object of the present invention is to provide OELD device having improved image resolution and high aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a dual type organic electroluminescent device includes first and second substrates bonded together by a seal pattern, the first and second substrates including a plurality of sub-pixel regions, a plurality of array elements including a plurality of thin film transistors on the first substrate, a plurality of organic electroluminescent diodes on the second substrate, each of the organic electroluminescent diodes having a first electrode on a rear surface of the second substrate, an organic electroluminescent layer on a rear surface of the first electrode, second electrode on a rear surface of the organic electroluminescent layer that correspond to respective ones of the sub-pixel regions, a plurality of connecting electrodes connected to the thin film transistors over the first substrate, a plurality of electrical connecting patterns formed on each of the connecting electrodes, each of the electrical connecting patterns electrically interconnecting each of the thin film transistors to one of the organic electroluminescent diodes, and a plurality of hygroscopic patterns formed on portions of the connecting electrodes.

In another aspect, a method of fabricating a dual type organic electroluminescent device includes forming a plurality of array elements including a plurality of thin film transistors on a first substrate, forming a plurality of organic electroluminescent diodes on a second substrate, each of the organic electroluminescent diodes having a first electrode on a rear surface of the second substrate, an organic electroluminescent layer on a rear surface of the first electrode, second electrode on a rear surface of the organic electroluminescent layer that correspond to one of a plurality sub-pixel regions, forming a plurality of connecting electrodes connected to the thin film transistors over the first substrate, forming a plurality of electrical connecting patterns on each of the connecting electrodes, each of the electrical connecting patterns electrically interconnecting each of the thin film transistors to one of the organic electroluminescent diodes, forming a plurality of hygroscopic patterns on portions of the connecting electrodes, and bonding the first and second substrates bonded together with a seal pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
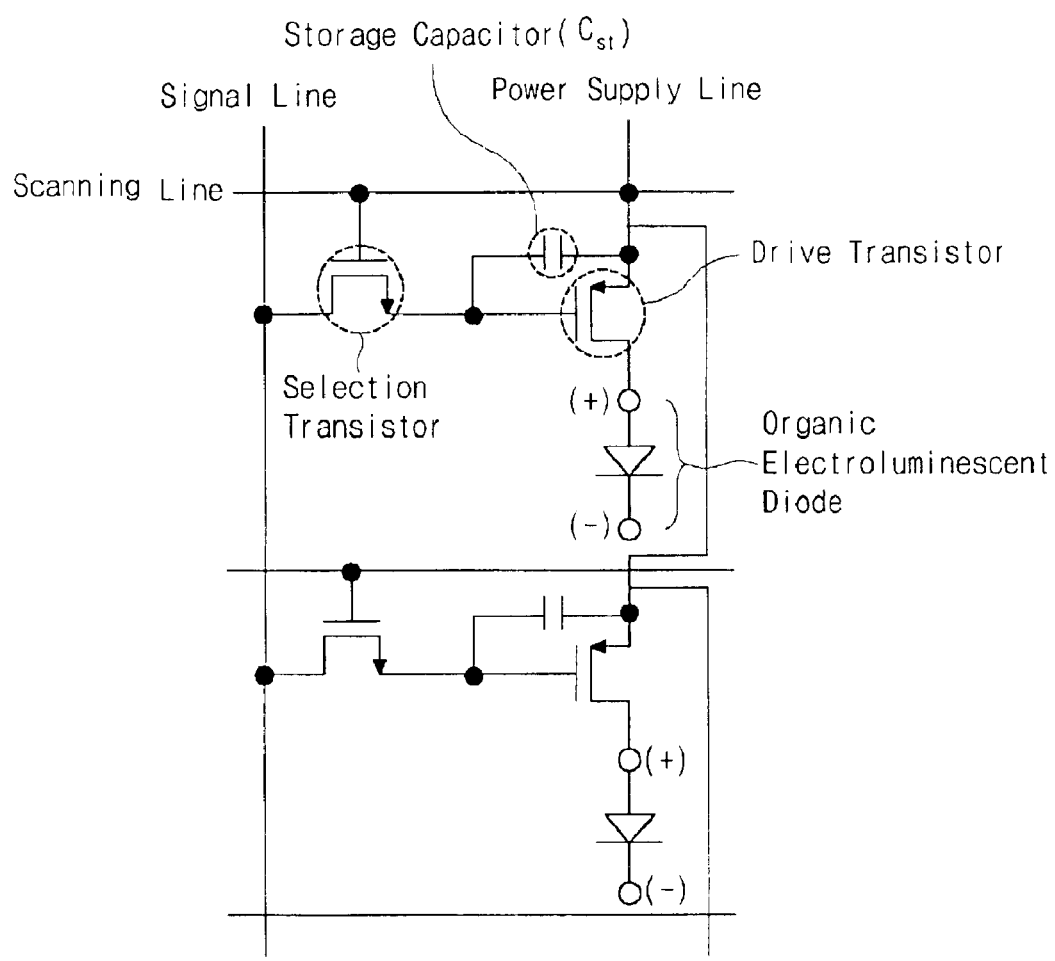
FIG. 1 is a schematic circuit diagram of a pixel region in a active matrix type OELD device according to the related art.
Figure 2:
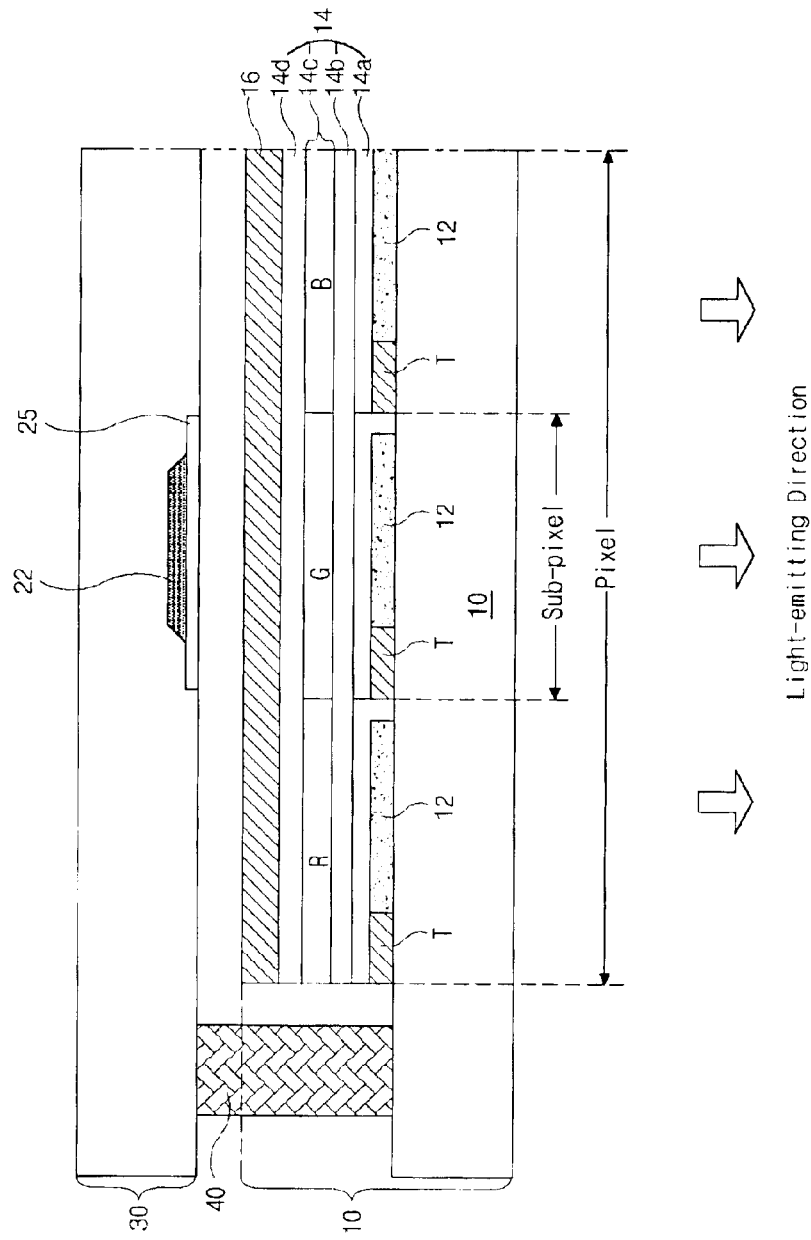
FIG. 2 is a partial cross sectional view of a bottom emission type OELD device including one pixel region having red (R), green (G), and blue (B) sub-pixel regions according to the related art.
Figure 3:
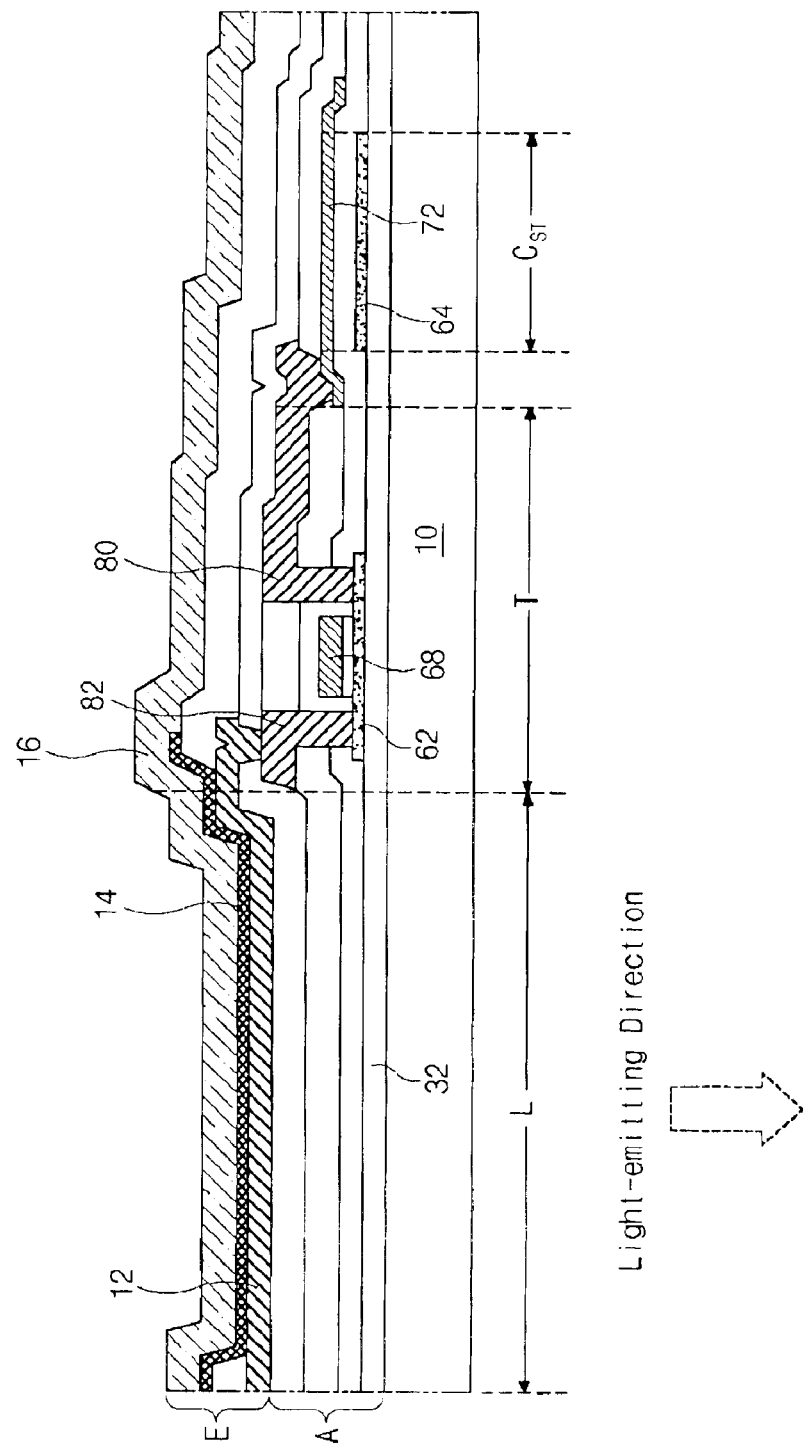
FIG. 3 is an enlarged cross sectional view of one pixel of the bottom emission type OELD device of FIG. 2 according to the related art.
Figure 4:
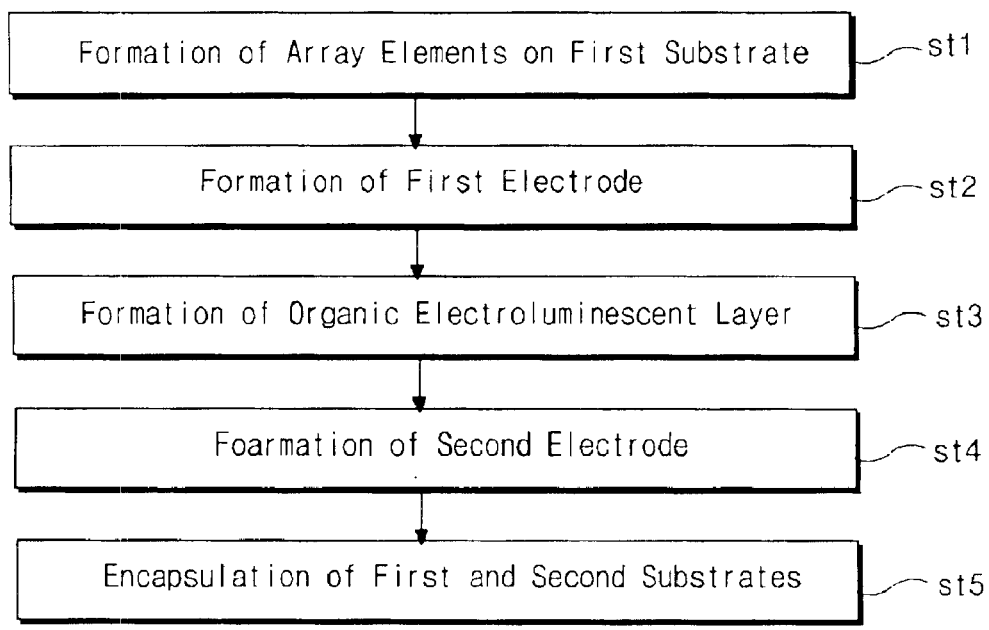
FIG. 4 is a flow chart showing a fabrication process of the OELD device of FIG. 3 according to the related art.
Figure 5:
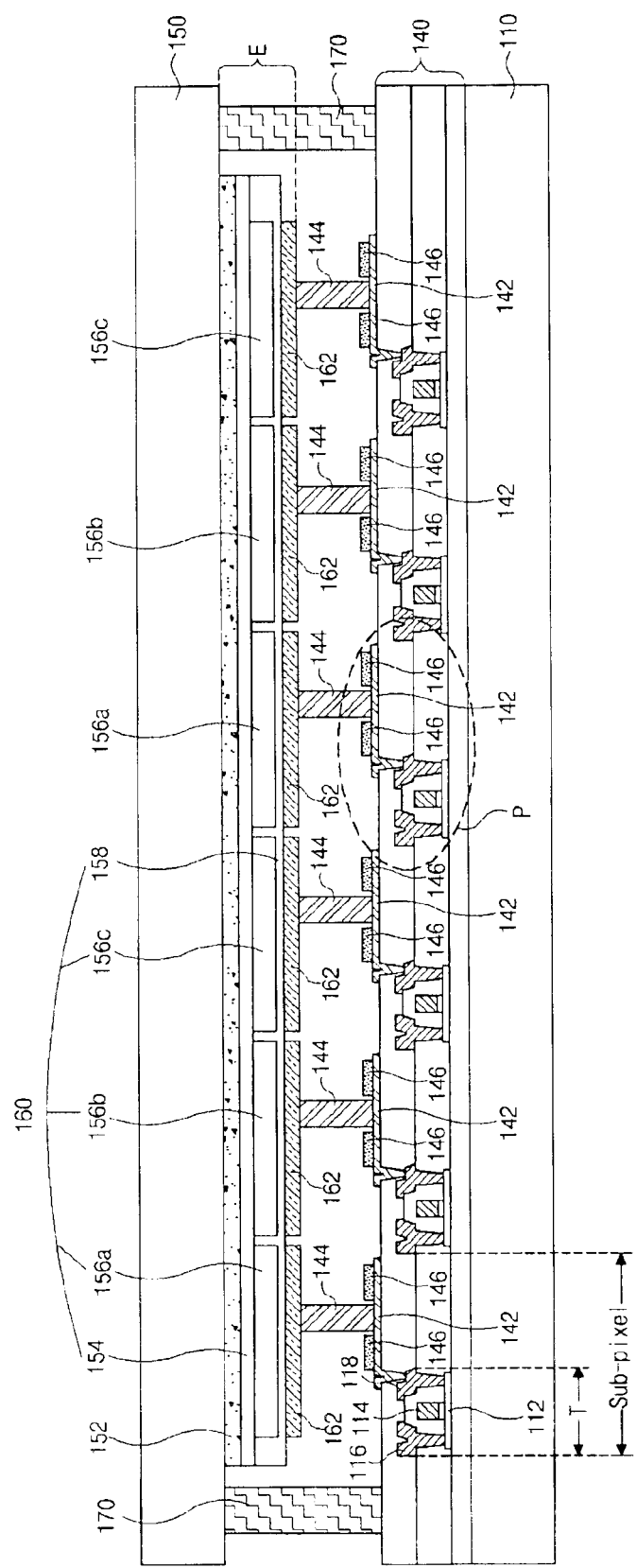
FIG. 5 is a partial cross sectional view of an exemplary OELD device according to the present invention.

FIG. 5 is a partial cross sectional view of an exemplary OELD device according to the present invention. In FIG. 5, first and second substrates 110 and 150 may be bonded together using a sealant material 170, wherein array elements 140 including a plurality of thin film transistors T may be formed over a front surface of the first substrate 110 and each of the thin film transistors T may be disposed within each one of a plurality of sub-pixel regions. In addition, a plurality of connecting electrodes 142 may be formed over the array elements 140, wherein each of the connecting electrodes 142 may be connected to each of the thin film transistors T. A plurality of electrical connecting patterns 144 may be disposed between the first and second substrates 110 and 150 such that each of the electrical connecting patterns 144 may be electrically connected to each of the connecting electrodes 142, and each of the electrical connecting patterns 144 may have a pillar shape. Furthermore, a plurality of hygroscopic patterns 146 may be formed between the first and second substrates 110 and 150 such that each of the hygroscopic patterns 146 may be provide on each of the connecting electrodes 142. Alternatively, the hygroscopic patterns 146 may cover an entire surface of each of the connecting electrodes 142 except for portions of the electrical connecting patterns 144. Accordingly, each of the sub-pixel regions may include the thin film transistor T, one of the connecting electrodes 142, one of the electrical connecting patterns 144, and one of the hygroscopic patterns 146.

According to the present invention, the connecting electrodes 142 and the electrical connecting patterns 144 are formed of conductive material(s). Additionally, although FIG. 5 shows that each of the electrical connecting patterns 144 have a single-layered structure, the electrical connecting patterns 144 may have a multi-layered structure with an insulator therein. Moreover, the connecting patterns 142 may be omitted such that the electrical connecting patterns 144 may directly contact each of the thin film transistors T.

Each of the thin film transistors T may include a semiconductor layer 112, a gate electrode 114, a source electrode 116, and a drain electrode 118. Each of the connecting electrodes 142 may contact one of the drain electrodes 118 of the thin film transistors T so that a corresponding one of the electrical connecting patterns 142 electrically communicates with one of the drain electrodes 118 of the thin film transistors T.

In FIG. 5, a plurality of organic electroluminescent diodes E may be disposed on a rear surface of the second substrate 150. Each of the organic electroluminescent diodes E may include a first electrode 152, an organic electroluminescent layer 160, and a second electrode 162, wherein the first electrode 152 may be disposed on an entire surface of the second substrate 150 to function as a common electrode. The organic electroluminescent layer 160 may include a first carrier transporting layer 154, a luminous layer 156, and a second carrier transporting layer 158 in series. Accordingly, the first carrier transporting layer 154 may be interposed between the first electrode 152 and the luminous layer 156, and the second carrier transporting layer 158 may be interposed between the luminous layer 156 and the second electrode 162. The first and second carrier transporting layers 154 and 158 may inject and transport electrons or holes into the luminous layer 156. The luminous layer 156 may include red, green, and blue luminous layers 156a, 156b, and 156c that are disposed in an alternate order corresponding to the sub-pixels regions. In addition, the second electrode 162 may be divided into a plurality of second electrodes 162 each corresponding to one of the sub-pixel regions similar to the luminous layer 156.

The multiple structure of the organic electroluminescent layer 160 may be determined depending on whether the first electrode 152 functions as an anode or a cathode. For example, if the first electrode 152 is an anode and the second electrode 158 is a cathode, then the first carrier transporting layer 154 may include a hole injection layer and a hole transporting layer in series from the first electrode 152, and the second carrier transporting layer 158 may include an electron injection layer and an electrode transporting layer in series from the second electrode 152.

In FIG. 5, top portions of each of the electrical connecting patterns 144 may contact a rear surface of each of the second electrodes 162 so that each of the electrical connecting patterns 144 electrically connect a corresponding one of the connecting electrodes 142 to one of the second electrodes 162 of the organic electroluminescent diode E. Accordingly, an electric current flowing into one of the thin film transistors T may be transferred to a corresponding one of the second electrodes 162 of the organic electroluminescent diode E through one of the connecting electrodes 142 and one of the electrical connecting patterns 144.

Although the thin film transistors T shown in FIG. 5 may be the driving thin film transistors that are connected to and operate the organic electroluminescent diodes E, at least one of the switching thin film transistors should be disposed within each of the sub-pixel regions. For example, each of the thin film transistors T may include at least one thin film transistor and at least one switching thin film transistor.

In FIG. 5, the hygroscopic patterns 146 may be formed within each of the sub-pixel regions. However, it may be possible to form the hygroscopic patterns 146 over an entire surface of the first substrate 110 to cover the connecting electrodes 142 and the thin film transistors T. When patterning the hygroscopic material into each of the sub-pixel regions, a shadow mask method, or a method of dispensing a gel-type hygroscopic material or a moisture absorbent material may be selectively used. To ensure good adhesion between the connecting electrodes 142 and the electrical connecting patterns 144, the electrical connecting patterns 144 may be formed on the connecting electrodes 142 before formation of the hygroscopic patterns 146.

Figure 6:
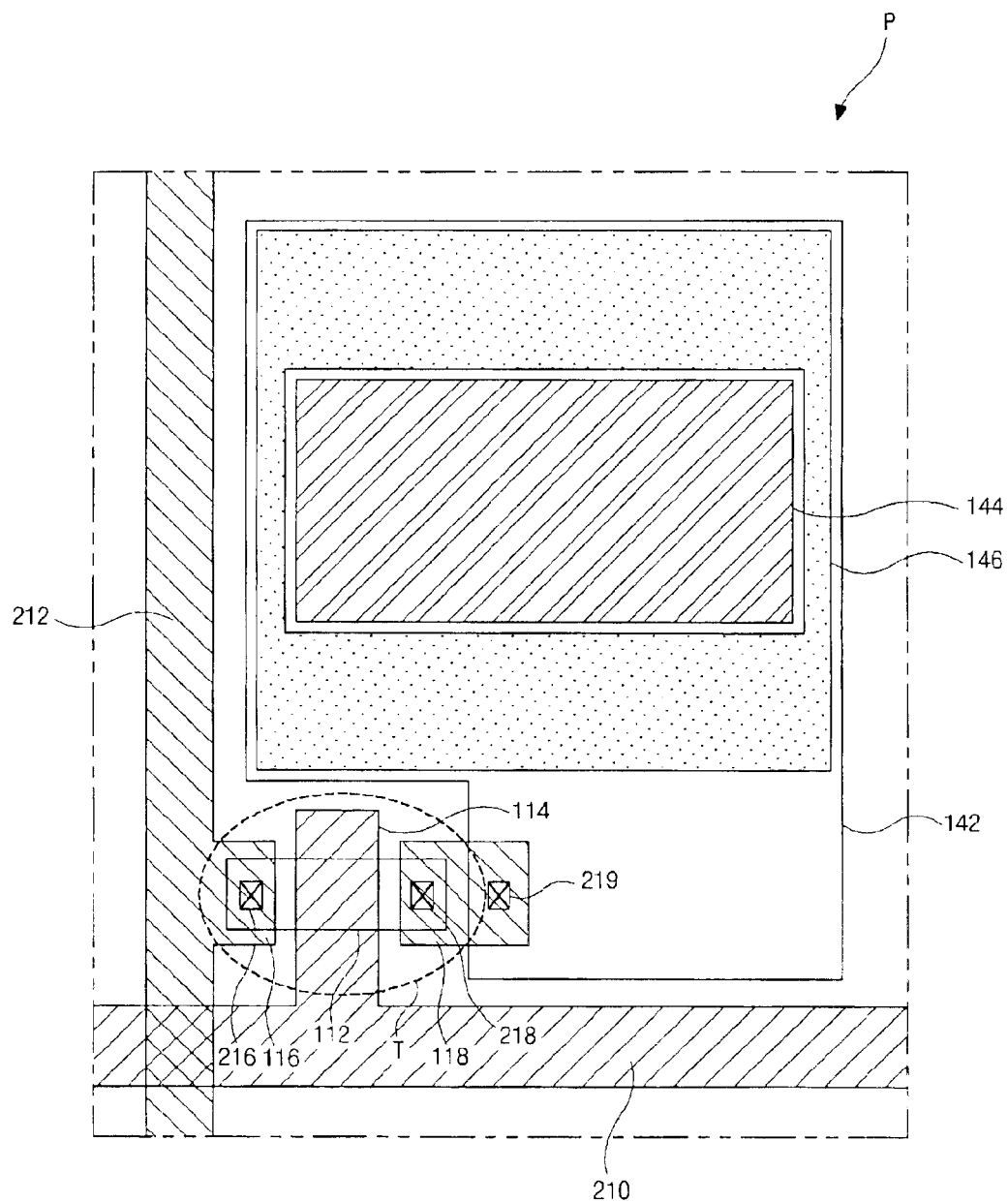
FIG. 6 is an enlarged plan view of an exemplary portion P of FIG. 5 showing electrical and hygroscopic patterns according to the present invention.

FIG. 6 is an enlarged plan view of an exemplary portion P of FIG. 5 showing electrical and hygroscopic patterns according to the present invention. In FIG. 6, a first line 210 may be formed along a first direction to receive a signal from a switching thin film transistor. In addition, a second line 212 may be formed along a second direction to receive a signal from a power line. The thin film transistor T, which may be a driving thin film transistor, maybe disposed at a crossing of the first and second lines 210 and 212. The connecting electrode 142 may be formed over the thin film transistor T and may contact the thin film transistor T though a contact hole 219.

The thin film transistor T may include the active layer 112, the gate electrode 114, the source electrode 116, and the drain electrode 118, wherein the gate electrode 114 may extend from the first line 210 to receive the signal from the switching thin film transistor. The source electrode 116 may extend from the second line 212 to receive the signal from the power line, and the drain electrode 118 may be disposed opposite to the source electrode 116 across the gate electrode 114. The active layer 112 may be disposed beneath the gate electrode 114, the source electrode 116, and the drain electrode 118, wherein the source and drain electrodes 116 and 118 may contact the active layer 112 through first and second contact holes 216 and 218, respectively. When the connecting electrode 142 contacts the thin film transistor T, the connecting electrode 142 contacts the drain electrode 118 through a third contact hole 219.

In FIG. 6, the electrical connecting pattern 144 may be disposed on a central portion of the connecting electrode 142 Although the electrical connecting pattern 144 has a quadrangular shape in FIG. 6, it may have other geometrical shapes, such as circular, triangular, square, oval, and hexagonal shapes. The hygroscopic pattern 146 may be formed on the connecting electrode 142 to cover almost an entire surface of the connecting electrode 142 to surround the electrical connecting pattern 144. Alternatively, the hygroscopic pattern 146 may be spaced apart from the electrical connecting pattern 144 by a desired distance.

Figure 7:
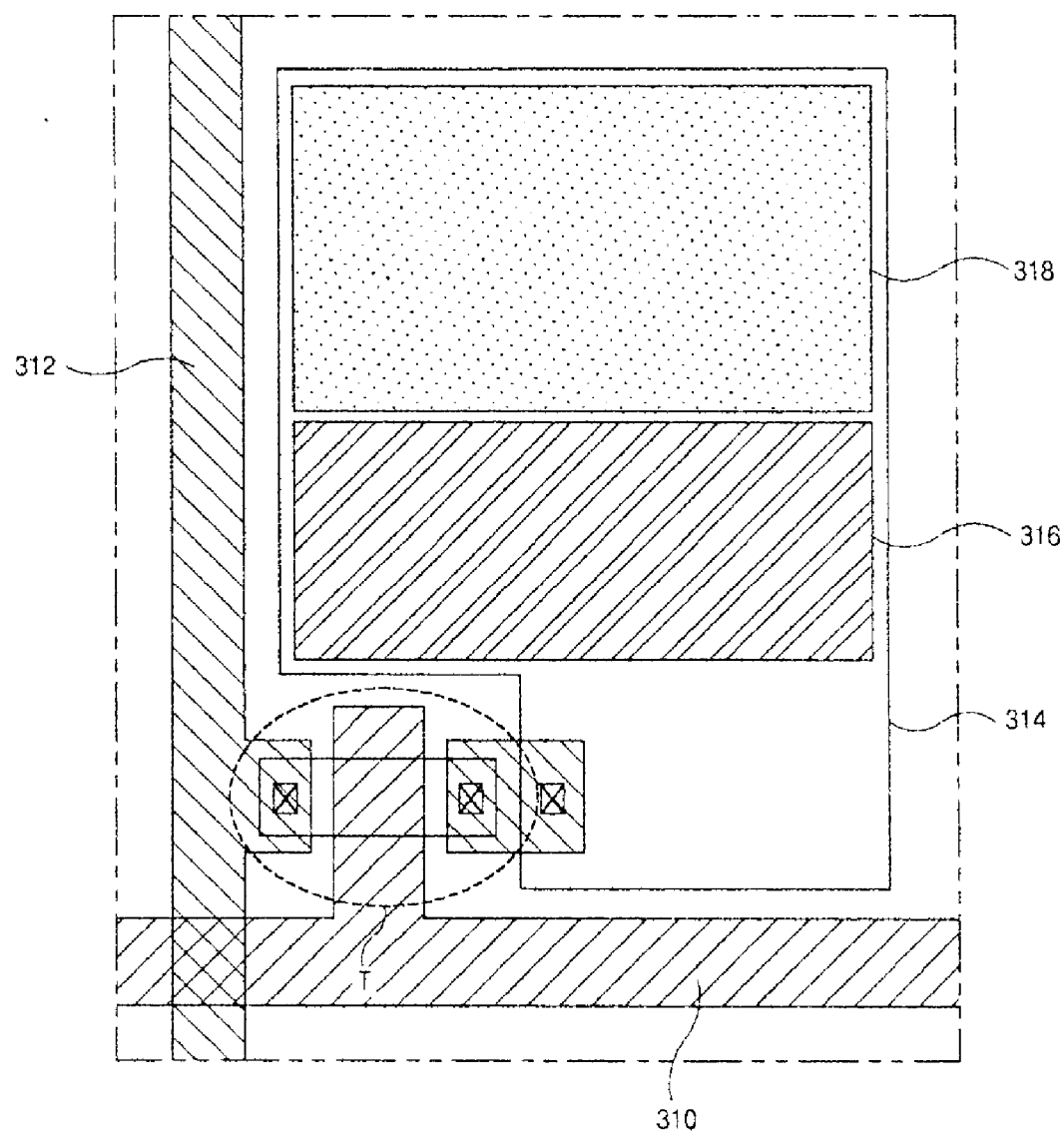
FIG. 7 is an enlarged plan view of another exemplary portion P of FIG. 5 showing electrical and hygroscopic patterns according to the present invention.

FIG. 7 is an enlarged plan view of another exemplary portion P of FIG. 5 showing electrical and hygroscopic patterns according to the present invention. The exemplary portion P in FIG. 7 may be similar to the exemplary portion P shown in FIG. 6. Accordingly, some detailed explanations have been omitted for simplicity. In FIG. 7, first and second lines 310 and 312 may be disposed to supply signals to the thin film transistor T. In addition, a connecting electrode 314 may be provided to be connected with the thin film transistor T through a contact hole, similar to that shown in FIG. 6. However, in FIG. 7, an electrical connecting pattern 316 may be disposed near the thin film transistor T on a lower part of the connecting electrode 314, and a hygroscopic pattern 318 may be disposed on the upper part of the connecting electrode 314 to be spaced apart from the electrical connecting pattern 316. Alternatively, a position of the electrical connecting pattern 316 may be switched with a position of the hygroscopic pattern 318.

In FIGS. 6 and 7, the thin film transistor T may be the driving thin film transistors that supply the electric current to the organic electroluminescent diode. Furthermore, the second lines 212 and 312 may be the power lines that substantially supply the electric current to the organic electroluminescent diode through the thin film transistors T.

Accordingly, the hygroscopic patterns may be disposed on almost all of a portion of the connecting electrode except at a portion corresponding to the electrical connecting pattern. Thus, the hygroscopic pattern does not interrupt the electrical connection between the connecting electrode and the electrical connecting pattern. Although FIGS. 6 and 7 disclose two dispositions of the connecting electrode and the electrical connecting pattern, other arrangements and dispositions are possible. Moreover, the hygroscopic material may be formed to cover an entire surface of the substrate instead of being patterned within the sub-pixel region.

Accordingly, the present invention provides array elements on a first substrate and an organic electroluminescent device on a second substrate. The first substrate having the array elements and the second substrate having the organic electroluminescent device are fabricated separately and then the substrates are bonded together after an inspection determines whether the array elements on the first substrate or the organic electroluminescent device on the second substrate have any defects. If the first substrate having the array elements or the second substrate having the organic electroluminescent device is found to have any defects, each substrate can be easily replaced by another defect-free substrate. Therefore, a satisfactory and reliable organic electroluminescent display device can be obtained according to the present invention in a fabrication process having high productivity. Further, since the organic electroluminescent display device in accordance with the present invention is a top emission type where the emitted light is toward opposite to the substrate having the thin film transistors, the aperture ratio can be improved and it is easy to manufacture a thin film transistor having a designated shape. An improved resolution can also be obtained. Since the present invention includes a hygroscopic material over the entire of the first substrate except the portions for the electrical connecting pattern that connects the array elements of the first substrate to the organic electroluminescent diodes of the second substrate, the moisture does not affect and degrade the organic electroluminescent diodes.

Accordingly, the present invention has the following advantages. Since the array elements and the organic electroluminescent diodes are formed in the separate substrates, the superior productivity and the effective production management may be easily obtained. Since the present invention provides for the top-emission type OELD device, there are no limitations in designing the thin film transistors and the high aperture ratio and superior image resolution may be achieved. Moreover, since the hygroscopic material is disposed over the first substrate after forming the electrical connecting pattern, the OELD device can have a long life span and other hygroscopic pattern or moisture absorbent material does not have to be formed additionally in the second substrate, thereby increasing the process effectiveness.

It will be apparent to those skilled in the art that various modifications and variation can be made in the organic electroluminescent display device and method of fabricating an organic electroluminescent display device of the present invention without departing from the spirit or scope of the invention. Thus, it is intended that the present invention cover the modifications and variations of this invention provided they come within the scope of the appended claims and their equivalents.

What is claimed is:

1. A dual panel type organic electroluminescent display device, comprising:
    first and second substrates bonded together by a seal pattern, the first and second substrates including a plurality of sub-pixel regions;
    a plurality of array elements including a plurality of thin film transistors on the first substrate;
    a plurality of organic electroluminescent diodes on the second substrate, each of the organic electroluminescent diodes having a first electrode on a rear surface of the second substrate, an organic electroluminescent layer on a rear surface of the first electrode, a second electrode on a rear surface of the organic electroluminescent layer that corresponds to respective ones of the sub-pixel regions;
    a plurality of connecting electrodes connected to the thin film transistors over the first substrate;
    a plurality of electrical connecting patterns formed on each of the connecting electrodes, each of the electrical connecting patterns electrically interconnecting each of the thin film transistors to one of the organic electroluminescent diodes; and
    a plurality of hygroscopic patterns formed on portions of the connecting electrodes.

2. The device according to claim 1, wherein the hygroscopic patterns are disposed over an entire surface of the first substrate except for portions corresponding to the electrical connecting patterns.

3. The device according to claim 1, wherein the hygroscopic patterns are disposed corresponding to the connecting electrodes within the sub-pixel regions.

4. The device according to claim 3, wherein each of the hygroscopic patterns are disposed to surround each of the electrical connecting patterns.

5. The device according to claim 3, wherein the hygroscopic patterns are disposed on a lower portion of each of the connecting electrodes and the electrical connecting patterns are disposed on an upper portion of each of the connecting electrodes.

6. The device according to claim 3, wherein the hygroscopic patterns are disposed along a side portion of each of the connecting electrodes and the electrical connecting patterns are disposed along another side portion of each of the connecting electrodes.

7. The device according to claim 1, wherein the connecting electrodes include drain electrodes of the thin film transistors.

8. The device according to claim 1, wherein the hygroscopic patterns are formed over the first substrate using a shadow mask process.

9. The device according to claim 1, wherein the hygroscopic patterns are formed of a dispensed gel-type hygroscopic material over the first substrate.

10. The device according to claim 1, wherein each of the electrical connecting patterns have a pillar shape.

11. The device according to claim 1, wherein the thin film transistors include switching thin film transistors and driving thin film transistors.

12. The device according to claim 11, wherein the thin film transistors connected to the organic electroluminescent diodes by the electrical connecting patterns are the driving thin film transistors.

13. The device according to claim 12, wherein each of the driving thin film transistors include a gate electrode, a semiconductor layer, a drain electrode, and a source electrode.

14. The device according to claim 13, wherein one of the drain and source electrodes is one of the connecting electrodes electrically connected to the second electrodes of the organic electroluminescent diodes through the electrical connecting patterns.

15. The device according to claim 1, wherein the hygroscopic patterns are formed after forming the electrical connecting patterns on the connecting electrodes.

16. A method of fabricating a dual panel type organic electroluminescent display device, comprising:

forming a plurality of array elements including a plurality of thin film transistors on a first substrate;

forming a plurality of organic electroluminescent diodes on a second substrate, each of the organic electroluminescent diodes having a first electrode on a rear surface of the second substrate, an organic electroluminescent layer on a rear surface of the first electrode, a second electrode on a rear surface of the organic electroluminescent layer that corresponds to one of a plurality sub-pixel regions;

forming a plurality of connecting electrodes connected to the thin film transistors over the first substrate;

forming a plurality of electrical connecting patterns on each of the connecting electrodes, each of the electrical connecting patterns electrically interconnecting each of the thin film transistors to one of the organic electroluminescent diodes;

forming a plurality of hygroscopic patterns on portions of the connecting electrodes; and bonding the first and second substrates bonded together with a seal pattern.

17. The method according to claim 16, wherein the hygroscopic patterns are disposed over an entire surface of the first substrate except for portions corresponding to the electrical connecting patterns.

18. The method according to claim 16, wherein the hygroscopic patterns are disposed corresponding to the connecting electrodes within the sub-pixel regions.

19. The method according to claim 18, wherein each of the hygroscopic patterns are disposed to surround each of the electrical connecting patterns.

20. The method according to claim 18, wherein the hygroscopic patterns are disposed on a lower portion of each of the connecting electrodes and the electrical connecting patterns are disposed on an upper portion of each of the connecting electrodes.

21. The method according to claim 18, wherein the hygroscopic patterns are disposed along a side portion of each of the connecting electrodes and the electrical connecting patterns are disposed along another side portion of each of the connecting electrodes.

22. The method according to claim 16, wherein the connecting electrodes include drain electrodes of the thin film transistors.

23. The method according to claim 16, wherein the hygroscopic patterns are formed over the first substrate using a shadow mask process.

24. The method according to claim 16, wherein the hygroscopic patterns are formed of a dispensed gel-type hygroscopic material over the first substrate.

25. The method according to claim 16, wherein each of the electrical connecting patterns have a pillar shape.

26. The method according to claim 16, wherein the thin film transistors include switching thin film transistors and driving thin film transistors.

27. The method according to claim 26, wherein the thin film transistors connected to the organic electroluminescent diodes by the electrical connecting patterns are the driving thin film transistors.

28. The method according to claim 27, wherein each of the driving thin film transistors include a gate electrode, a semiconductor layer, a drain electrode, and a source electrode.

29. The method according to claim 28, wherein one of the drain and source electrodes is one of the connecting electrodes electrically connected to the second electrodes of the organic electroluminescent diodes through the electrical connecting patterns.

30. The method according to claim 16, wherein the hygroscopic patterns are formed after forming the electrical connecting patterns on the connecting electrodes.

* * * * *